United States Patent [19]
Bross et al.

[11] Patent Number: 5,514,949
[45] Date of Patent: May 7, 1996

[54] CURRENT MIRROR WITH AT LEAST ONE PNP-TRANSISTOR

[75] Inventors: Guenter Bross, Hayingen; Gerard Byrne, Rottenburg-Wurmlingen, both of Germany

[73] Assignee: Robert Bosch GmbH, Stuttgart, Germany

[21] Appl. No.: 190,012

[22] PCT Filed: May 7, 1993

[86] PCT No.: PCT/DE93/00401

§ 371 Date: Jan. 21, 1994

§ 102(e) Date: Jan. 21, 1994

[87] PCT Pub. No.: WO93/23876

PCT Pub. Date: Nov. 25, 1993

[30] Foreign Application Priority Data

May 21, 1992 [DE] Germany ............... 42 16 684.5

[51] Int. Cl.$^6$ .......................... G05F 3/16
[52] U.S. Cl. .................. 323/315; 257/561; 327/481
[58] Field of Search ................... 327/481, 538, 327/540, 564, 565; 257/560, 561, 562, 563, 564, 575, 574; 323/312, 313, 315

[56] References Cited

U.S. PATENT DOCUMENTS

| | | | |
|---|---|---|---|
| 3,958,267 | 5/1976 | Frederiksen et al. | 357/36 |
| 3,987,477 | 10/1976 | Krolik | 357/36 |
| 4,730,127 | 3/1988 | Susak | 307/299.3 |

FOREIGN PATENT DOCUMENTS

| | | |
|---|---|---|
| 0153492 | 9/1985 | European Pat. Off. . |
| 2466104 | 3/1981 | France . |
| 3813436A1 | 11/1989 | Germany . |

*Primary Examiner*—Peter S. Wong
*Assistant Examiner*—Y. Jessica Han
*Attorney, Agent, or Firm*—Kenyon & Kenyon

[57] ABSTRACT

A current mirror having at least one pnp-transistor and providing overvoltage protection has three collectors designed as partial collectors. Two of the partial collectors and the base are linked to a reference-current source and the other partial collector is linked to a terminal connection of the current source to be protected from overvoltage. In the event of an overvoltage across the terminal connection, an emitter is formed by the partial collector linked to this terminal connection which limits the received current in proportion, conditional upon the topology, with the mirror-reference current.

7 Claims, 2 Drawing Sheets

CURRENT MIRROR WITH AT LEAST ONE PNP-TRANSISTOR

FIELD OF THE INVENTION

The present invention relates to a current mirror having at least one pnp transistor. More specifically, the present invention relates to a current mirror having overvoltage protection.

BACKGROUND OF THE INVENTION

German Patent Application DE 38 13 436 A1 describes a current source designed to prevent the saturation of a given lateral pnp-transistor structure of an integrated switching arrangement, independently of type and without restricting the operating range. For this purpose, a protective collector placed concentrically around the self-concentric collector is used. German Patent Application DE 38 13 436 A1 does not disclose any protection against overvoltages. Moreover, the concentric protective collector requires a large transistor surface, and such a large transistor surface should be avoided.

SUMMARY OF THE INVENTION

The current mirror according to the present invention has at least one pnp transistor having a base, an emitter, a first partial collector and a second partial collector, with the collectors essentially encircling the emitter. The first partial collector and the base are linked to a reference current source. The second partial collector is linked to a terminal connection. The first and second partial collectors are designed to protect against an overvoltage condition across the terminal connection. The advantage of the current mirror according to the present invention is that, for example, the input or output of the current mirror is automatically protected from overvoltage without necessitating additional circuit expenditure, i.e., neither comparators nor closed-loop control circuits, or the like, are needed. The configuration according to the present invention requires a very small surface area and, in the event of overvoltage, the received current is only able to rise to a limiting value. This limiting current is able to be reduced virtually as needed through the topology, i.e., the layout.

A further advantage of a current mirror design in accordance with the present invention is obtained through the application of two pnp-transistors in a current-mirror circuit. The two pnp-transistors are disposed side-by-side in a shared pan having a common base, thereby allowing the maximum overcurrent to be reduced still further in the event of an overvoltage condition. In this case, the first partial collector of the first transistor connected to the reference-current source is arranged directly next to the second partial collector linked to the terminal connection of the second transistor to be protected from overvoltage, so that the partial collector connected to the reference-current source is confronted with a large parasitic emitter surface.

A still further advantage in accordance with the present invention is achieved by having the two second partial collectors of the two transistors linked to the terminal connection face one another, and an additional (third) collector surface connected to the reference-current source arranged in-between the two second partial collectors. This additional collector surface can have a lamellar, T-or double-T-shaped design, and is able to receive as optimally as possible the emitter current from the two parasitic emitters formed in the event of overvoltage.

Another advantage in accordance with the present invention is achieved by having the two first partial collectors of the two transistors connected to the reference-current source face one another, and an additional collector surface joined to the terminal connection being disposed in-between the two first partial collectors. It proves to be especially beneficial here to design the additional collector surface as a one-piece collector surface of another transistor. When, in addition, still other collector surfaces connected to the reference-current source are arranged along the two outwardly pointing partial collectors of the two transistors linked to the terminal connection, then the ratio of the overvoltage current to the reference current can be reduced to the value of 0.75. Thus, one is able to provide a still better protection from overvoltages, or rather overcurrents.

Another advantage in accordance with the present invention is that the inner and/or outer edges of the collectors are essentially square, so that the transition surfaces or edges can be arranged very close together.

DETAILED DESCRIPTION

Figure 1:
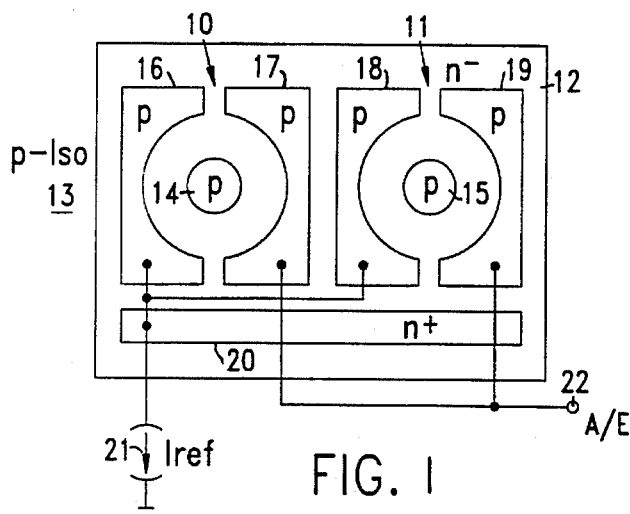
FIG. 1 is the topology of two transistors in a current mirror circuit in accordance with a first embodiment of the present invention.

In the case of the topology of a lateral pnp-transistor structure depicted in FIG. 1 as a first exemplary embodiment, two transistors 10,11 connected as a current mirror are arranged next to one another in a n$^-$-pan 12, which in turn is embedded in a p-insulation 13. In the case of each of the two transistors 10,11, a disk-shaped emitter 14 or 15 is surrounded in each case in a ring shape by two partial collectors 16,17 or 18,19, the partial collectors 16,17 of the transistor 10 being separated from one another by a vertical separating line in the figure. The partial collectors 18,19 of the transistor 11 also are separated from one another by a vertical separating line in the Figure. While the inside contour of the partial collectors 16,17, on the one hand, and 18,19, on the other hand, is essentially circular, the outside contour is essentially square, so that the partial collector 17 of the transistor 10 is separated by a parallel strip of the pan from the partial collector 18 of the transistor 11. A lamellar n$^+$-base terminal 20—described for simplification as "base" in the following—runs parallel to and underneath the transistors 10,11 and extends over their entire length. The two partial collectors 16,18 of the two transistors 10,11 are connected to the base 20 and jointly linked to a reference-current source 21. The two partial collectors 17,19 are joined together and linked to an input-output terminal (A/E) 22. This terminal 22 can be replaced by an internal circuit node, for example, as a terminal connection which is to be protected against overvoltage.

Figure 2:
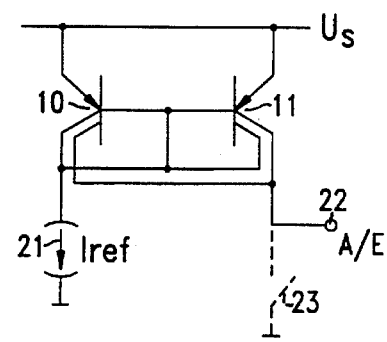
FIG. 2 is the circuit diagram of the transistors shown in FIG. 1.

FIG. 2 depicts the arrangement shown in FIG. 1 as a circuit diagram. The two emitters 14,15 receive a supply voltage Us. The depicted configuration acting as a current source is used, for example, to produce a "high" potential at chip outputs or inputs with a corresponding preferred position or internally in a circuit, in which such a "high" potential is required. A switch 23 depicted with a dotted line, for example an npn-transistor, can be used, for instance, to switch over the "high" potential across the terminal 22 to a "low" potential.

Figure 3:
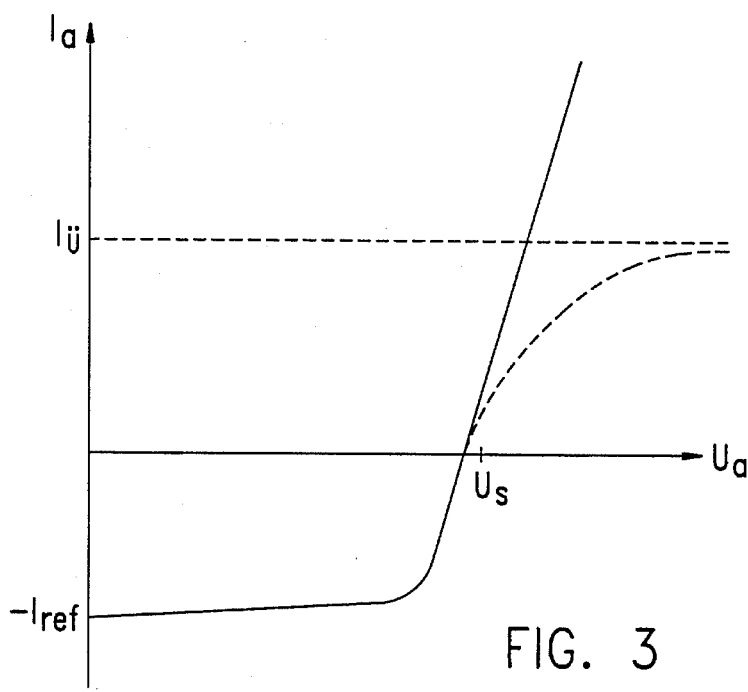
FIG. 3 is a current-voltage diagram for clarifying a mode of operation in accordance with the present invention.

If the collectors of the transistors 10,11 were realized as one-piece collectors, then in the event of overvoltage, i.e., in the event that an output voltage Ua that exceeds the supply voltage Us is applied to the terminal 22, the output current Ia would rise steeply, and the configuration could be destroyed. This is shown by a solid line in FIG. 3.

For this reason, an overvoltage protection is realized. The basis of the overvoltage protection is that a pnp-collector functions as an emitter when it is applied to a more positive potential than that of the normal emitter. Therefore, when partial collectors are used as in accordance with FIG. 1, then the two partial collectors 17, 19, which are connected to the terminal 22, can act in the event of overvoltage as emitters with respect to the other partial collectors 16,18 and also with respect to the actual emitters 14 or 15. The received current can still only rise up to a limiting value Iü, which is in proportion, conditional upon the topology, with the mirror-reference current Iref. The maximum overvoltage before the component part is destroyed results as Pv/Iü. Pv is the maximum allowable power loss. Iü is able to be reduced virtually as needed within certain limits through the layout. Through the layout arrangement, the always present parasitic collector (p-insulation 13 and substrate) only receives a fraction of the new emitter current from the parasitic emitter formed by the partial collectors 17,19 in the event of overvoltage. The emitter current from the parasitic emitter is divided up among the surrounding p-regions, as is true of standard pnp-structures having divided collectors. Thus, for example, the current from the parasitic emitter formed by the partial collector 17 in the event of overvoltage can flow off toward the emitter 14, toward the partial collector 16 and toward the partial collector 18.

In a configuration in accordance with FIG. 1, a Iü/Iref ratio of 1.5–1.7 can be achieved, for example, given a reference current of 220 μA.

Figure 4:
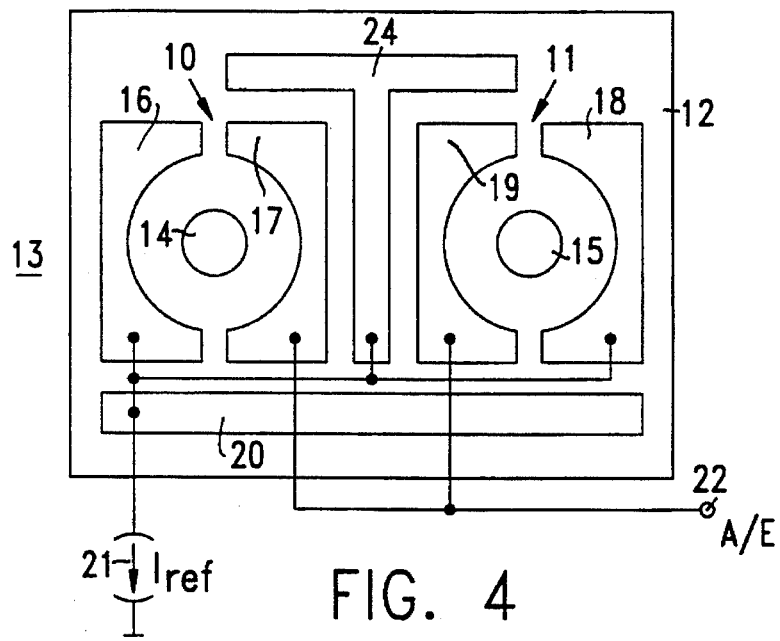
FIG. 4 is the topology of two transistors in a current mirror circuit with an additional collector arranged in-between the transistors in accordance with a second embodiment of the present invention.

The second exemplary embodiment depicted in FIG. 4 corresponds substantially with the first exemplary embodiment depicted in FIG. 1, so that the components that are the same or that have the same function are provided with the same reference symbols and are not described again. In FIG. 4 the partial collectors 18,19 are reversed in comparison with the first exemplary embodiment of FIG. 1, so that the two partial collectors 17,19 connected to the terminal 22 now face one another. A T-shaped, additional parasitic collector 24, which is linked to the reference-current source 21, is arranged in-between the partial collectors 17, 19. The base strip of the T-shaped collector 24 runs thereby in a parallel direction between the partial collectors 17,19, while the cross-wise branch essentially spans the partial collectors 16,18 up to the separation point. This T-shaped collector 24 can also be replaced by a simpler, lamellar collector between the partial collectors 17,19, or by a double-T-shaped collector 24 that extends over the partial collectors 17,19 on all peripheries. The parasitic collector can, for example, intentionally limit the current in the event of an overvoltage.

In normal operation, the additional collector 24 is not active. However, in the event of overvoltage, it receives a component of the emitter current from the parasitic emitter formed by the partial collectors 17,19, so that the insulation and substrate current content are further reduced. Such a configuration enables the ratio of Iü/Iref to be reduced to the value 1.

Figure 5:
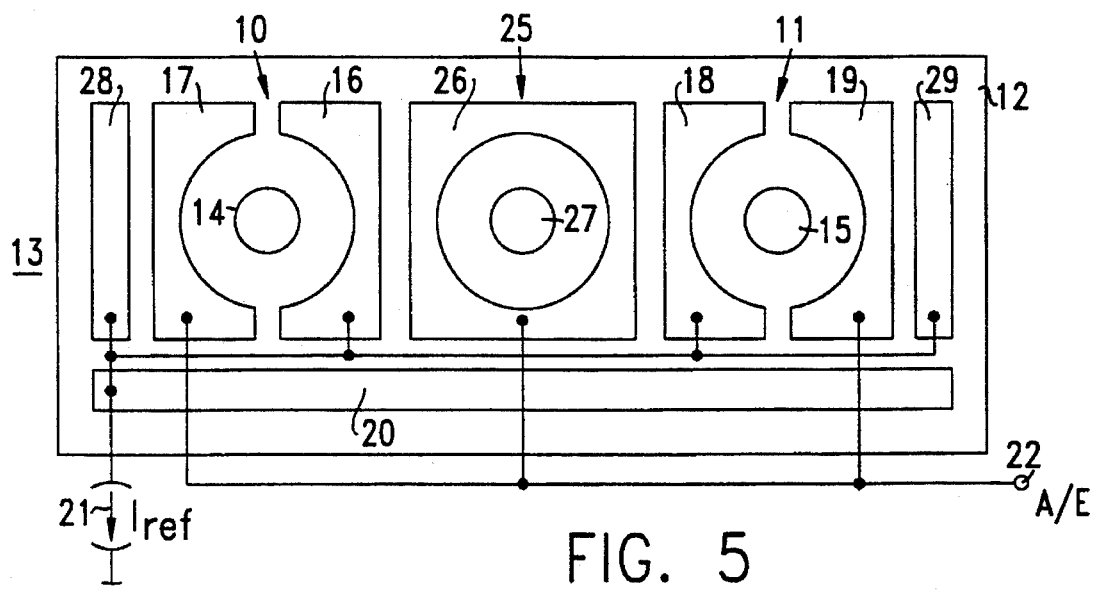
FIG. 5 is the topology of three transistors arranged side-by-side in accordance with a third embodiment of the present invention.

The third exemplary embodiment depicted in FIG. 5 also has a great deal in common with the first exemplary embodiment in FIG. 1 and the second exemplary embodiment in FIG. 4, so that here again, components that are the same or that have the same function are provided with the same reference symbols and are not described again.

The arrangement of the topology of the two transistors 10,11 is such that the two partial collectors 17,19 connected to the terminal 22 face away from one another, and thus are arranged on the outside, while the two other partial collectors 16,18 connected to the reference-current source 21 face one another. Arranged between these partial collectors 16,18 is another transistor 25 having a one-piece collector 26, which encircles an emitter 27. The collector 26 is linked to the terminal 22, i.e., it acts in the event of overvoltage as an additional parasitic emitter, whose current is received for the most part by the partial collectors 16,18 of the transistors 10,11. Furthermore, additional lamellar collectors 28,29, which run parallel to the outside edge of the partial collectors 17,19 and are connected to the reference-current source 21, are arranged along the partial collectors 17,19 of the transistors 10,11.

Figure 6:
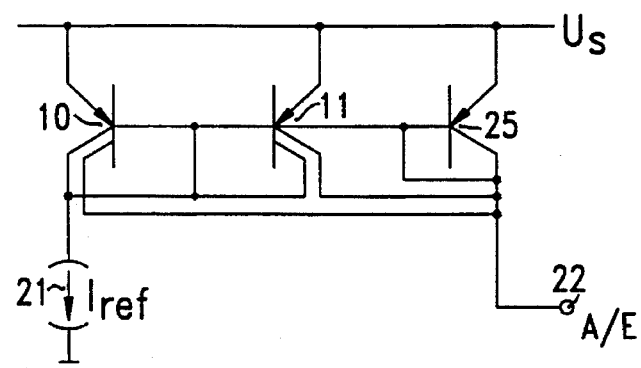
FIG. 6 is the circuit diagram of the transistors depicted in FIG. 5.

FIG. 6 illustrates the corresponding circuit diagram of the topology arrangement shown in FIG. 5. In the event of overvoltage, the partial collectors 17,19 connected to the terminal 22, as well as the collector 26 of the transistor 25 act as parasitic emitters, whose current is essentially received by the partial collectors 16,18, the additional collectors 28,29 and the actual emitters 14,15, as well as 27. This configuration allows the ratio of Iü/Iref to be reduced to a value of more or less 0.75, so that a still better overvoltage protection is achieved.

Of course, variations of the depicted and described topological surfaces are still possible. Thus, the two additional collectors 28,29 can also have an L- or U-shaped design. Furthermore, in the individual case, the collectors encircling the emitters can also have a round individual contour, in which case adjacent, additional collectors then have a correspondingly adapted shape.

Furthermore, it is possible to use partial collectors or additional collectors for acknowledgement feedback when an overvoltage occurs across the collector. This makes it possible to dispense with additional means for detecting such overvoltages.

In a simple variant, it is also possible to use only one single transistor having two partial collectors, for example the transistor 10 in FIG. 1, while omitting transistor 11. In such a variant as well, an additional I-, L- or U-shaped collector can then be arranged adjacent to the partial collector 17 linked to the terminal 22 and be connected to the reference-current source 21.

What is claimed is:

1. A current mirror comprising:
   a pnp transistor disposed in an n-well, the pnp transistor including
      a base,
      an emitter which receives a first positive voltage,
      a first partial collector, and
      a second partial collector;

a third partial collector;.

a reference current source connected to the base, to the first partial collector and to the third partial collector; and a terminal connection connected to the second partial collector, the second partial collector being arranged between the first partial collector and the third partial collector, wherein when a second positive voltage greater than the first positive voltage is applied to the terminal connection, the second partial collector functions as a new emitter.

2. The current mirror according to claim 1, wherein the second partial collector is arranged directly next to the emitter.

3. The current mirror according to claim 2, wherein one of the first partial collector and the third partial collector is arranged directly next to the emitter.

4. The current mirror according to claim 3, wherein the third partial collector is arranged directly next to the second partial collector.

5. The current mirror according to claim 4, herein the second partial collector has an outer contour that is essentially square and an additional collector has an outer contour that is essentially parallel to the second partial collector outer contour.

6. The current mirror according to claim 5, wherein the additional collector has a T-shape.

7. The current mirror according to claim 1, further comprising at least one additional pnp transistor disposed in the n-well.

* * * * *